United States Patent
Goo et al.

(10) Patent No.: US 11,492,289 B2
(45) Date of Patent: Nov. 8, 2022

(54) FOLDABLE GLASS SUBSTRATE AND FOLDABLE DISPLAY DEVICE INCLUDING THE SAME

(71) Applicants: Samsung Display Co., Ltd., Yongin-Si (KR); DOWOOINSYS Co., Ltd., Cheongju-si (KR)

(72) Inventors: Bon Ki Goo, Chungcheongbuk-do (KR); Myung-Hwan Kim, Seongnam-si (KR); Sungchul Kim, Seongnam-si (KR); Jeong-Il Yoo, Seoul (KR); Jangdoo Lee, Hwaseong-si (KR)

(73) Assignees: SAMSUNG DISPLAY CO., LTD., Gyeonggi-Do (KR); DOWOOINSYS CO., LTD., Chungcheongbuk-Do (KR)

(*) Notice: Subject to any disclaimer, the term of this patent is extended or adjusted under 35 U.S.C. 154(b) by 174 days.

(21) Appl. No.: 17/096,050

(22) Filed: Nov. 12, 2020

(65) Prior Publication Data
US 2021/0147286 A1 May 20, 2021

(30) Foreign Application Priority Data
Nov. 14, 2019 (KR) .................. 10-2019-0146087

(51) Int. Cl.
*H01L 51/00* (2006.01)
*H01L 51/52* (2006.01)
(Continued)

(52) U.S. Cl.
CPC ............ *C03C 15/00* (2013.01); *C03C 21/002* (2013.01); *H01L 51/5253* (2013.01);
(Continued)

(58) Field of Classification Search
CPC ............. H01L 51/5253; H01L 51/0096; H01L 51/0097; H01L 2251/5338;
(Continued)

(56) References Cited

U.S. PATENT DOCUMENTS 8,062,732 B2    11/2011  Sabia et al.
8,896,202 B2 *  11/2014  Oh .................. H01L 51/5237
                                                   313/511
(Continued)

FOREIGN PATENT DOCUMENTS

KR    101298236 B1    8/2013
KR    101684344 B1    12/2016
(Continued)

OTHER PUBLICATIONS

Matthewson, et al., Strength Measurement of Optical Fibers by Bending, Journal of the American Ceramic Society vol. 69, No. 11, pp. 815-821 (Nov. 1986).

*Primary Examiner* — Ida M Soward
(74) *Attorney, Agent, or Firm* — Cantor Colburn LLP

(57) ABSTRACT

A foldable glass substrate includes a top surface, a bottom surface, and a side surface. The side surface includes a first side surface extending at a first angle from the top surface, a second side surface extending at a second angle from the bottom surface, and a third side surface extending from each of the first side surface and the second side surface. A length of the third side surface in a direction substantially perpendicular to at least one of the top surface and the bottom surface is equal to or greater than about 0.3 times and equal to or less than about 0.7 times of a minimum distance between the top surface and the bottom surface. The minimum distance is equal to or greater than about 15 micrometers (μm) and equal to or less than about 100 μm.

20 Claims, 15 Drawing Sheets

(51) Int. Cl.
*H01L 27/14* (2006.01)
*H01L 27/32* (2006.01)
*G02F 1/133* (2006.01)
*G06F 1/16* (2006.01)
*G09F 9/30* (2006.01)
*C03C 15/00* (2006.01)
*C03C 21/00* (2006.01)
*G02F 1/1333* (2006.01)
*H01L 27/146* (2006.01)

(52) U.S. Cl.
CPC ...... *G02F 1/133305* (2013.01); *G06F 1/1652* (2013.01); *H01L 27/14678* (2013.01); *H01L 27/323* (2013.01); *H01L 2251/5338* (2013.01)

(58) Field of Classification Search
CPC ............. H01L 2251/301; H01L 27/323; H01L 27/14678; G02F 1/133305; G02F 1/1652; G09F 9/301
See application file for complete search history.

(56) References Cited

U.S. PATENT DOCUMENTS

| | | | |
|---|---|---|---|
| 9,700,985 | B2 | 7/2017 | Kashima et al. |
| 10,216,230 | B2 | 2/2019 | Kim et al. |
| 2010/0264817 | A1* | 10/2010 | Bouten ................. G02F 1/1339 |
| | | | 313/512 |
| 2011/0050657 | A1* | 3/2011 | Yamada .............. H01L 27/3293 |
| | | | 361/679.01 |
| 2015/0210588 | A1 | 7/2015 | Chang et al. |
| 2015/0210589 | A1 | 7/2015 | Chang et al. |
| 2015/0210590 | A1 | 7/2015 | Chang et al. |
| 2016/0224069 | A1 | 8/2016 | Chang et al. |
| 2016/0354996 | A1* | 12/2016 | Alder ................ B32B 17/10091 |
| 2018/0101253 | A1 | 4/2018 | He et al. |
| 2018/0155238 | A1 | 6/2018 | Kim et al. |

FOREIGN PATENT DOCUMENTS

| | | |
|---|---|---|
| KR | 101972444 B1 | 4/2019 |
| WO | 2019218155 A1 | 11/2019 |

\* cited by examiner

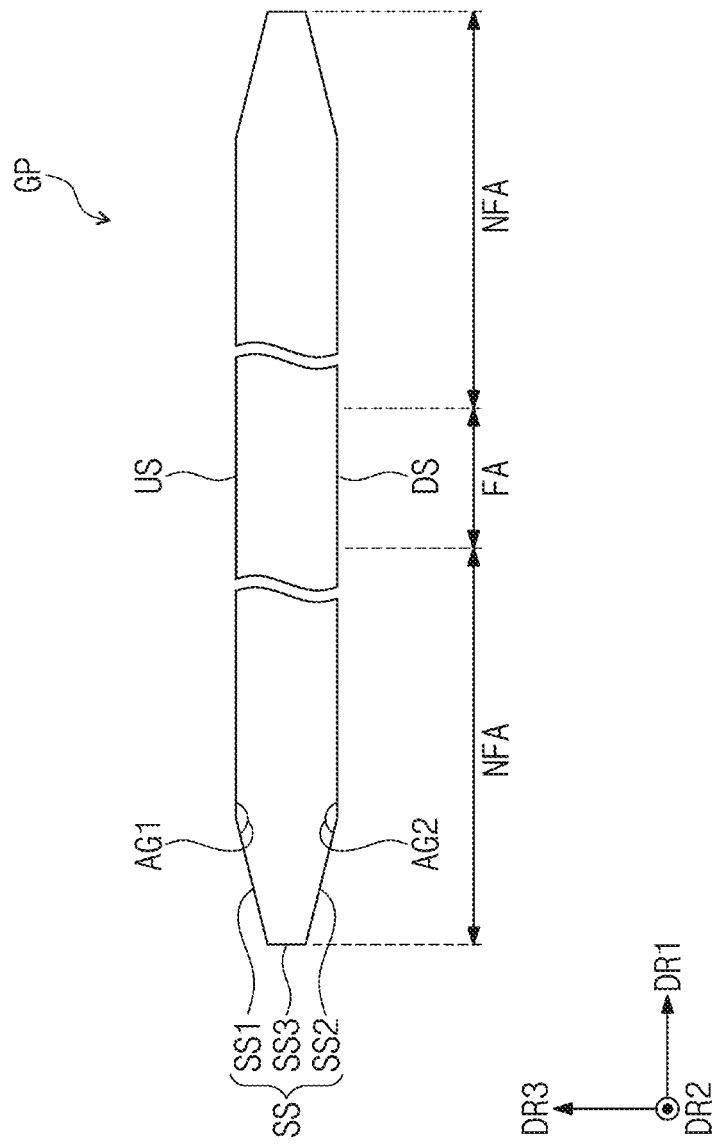

Embodiment 1

Comparative example 1

Comparative example 2

FOLDABLE GLASS SUBSTRATE AND FOLDABLE DISPLAY DEVICE INCLUDING THE SAME

This application claims priority to Korean Patent Application No. 10-2019-0146087, filed on Nov. 14, 2019, and all the benefits accruing therefrom under 35 U.S.C. § 119, the content of which in its entirety is herein incorporated by reference.

BACKGROUND

1. Field

Exemplary embodiments of the invention herein relate to a foldable glass substrate and a foldable display device including the same. More particularly, exemplary embodiments of the invention herein relate to a foldable glass substrate having a substantially improved durability against an impact and a foldable display device including the same.

2. Description of Related Art

A glass substrate has been variously applied to electronic devices such as an organic light emitting display. The glass substrate is used as a substrate of a display panel of the electronic devices including televisions, computer monitors, portable terminals, etc., or as a cover glass for protecting the display panel of the electronic devices.

Also, researches on a foldable glass substrate having a strong durability are being progressed in order to apply the glass substrate to a foldable display device.

SUMMARY

Exemplary embodiments of the invention provide a foldable glass substrate having a substantially high bending strength and a substantially high durability.

Exemplary embodiments of the invention also provide a foldable display device including a glass substrate having a substantially high bending strength and a substantially high durability.

An exemplary embodiment of the invention provides a foldable glass substrate including a top surface, a bottom surface facing the top surface, and a side surface extending from each of the top surface and the bottom surface. The side surface includes a first side surface extending at a first angle from the top surface, a second side surface extending at a second angle from the bottom surface, and a third side surface extending from each of the first side surface and the second side surface. A length of the third side surface in a direction substantially perpendicular to at least one of the top surface and the bottom surface is equal to or greater than about 0.3 times and equal to or less than about 0.7 times of a minimum distance between the top surface and the bottom surface. The minimum distance is equal to or greater than about 15 micrometers (μm) and equal to or less than about 100 μm.

In an exemplary embodiment, the top surface and the bottom surface may be parallel to each other, and the third side surface may be substantially perpendicular to each of the top surface and the bottom surface.

In an exemplary embodiment, a first plane extending from and parallel to the top surface and a second plane extending from and parallel to the bottom surface may be defined. A minimum distance between the third side surface and the first plane may be equal to or greater than about 0.9 times and equal to or less than about 1.1 times of a minimum distance between the third side surface and the second plane.

In an exemplary embodiment, the length may be equal to or greater than about 5 μm and equal to or less than about 70 μm, and the minimum distance may be equal to or greater than about 70 μm and equal to or less than about 100 μm.

In an exemplary embodiment, the length may be equal to or greater than about 35 μm and equal to or less than about 70 μm.

In an exemplary embodiment, the minimum distance may be equal to or greater than about 40 μm and equal to or less than about 70 μm, and the length may be equal to or greater than about 16 μm and equal to or less than about 42 μm.

In an exemplary embodiment, the minimum distance may be equal to or greater than about 15 μm and equal to or less than about 40 μm, and the length may be equal to or greater than about 4.5 μm and equal to or less than about 20 μm.

In an exemplary embodiment, each of the first angle and the second angle may be an obtuse angle.

In an exemplary embodiment, each of the first angle and the second angle may be equal to or greater than about 160 degrees (°) and equal to or less than about 170°.

In an exemplary embodiment, the glass substrate may include a reinforced area and a non-reinforced area surrounding the reinforced area and having a compressive stress less than that of the reinforced area.

In an exemplary embodiment, the reinforced area may include a first alkali metal cation.

In an exemplary embodiment, the non-reinforced area may include a second alkali metal cation having an ion radius less than that of the first alkali metal cation.

In an exemplary embodiment of the invention, a foldable glass substrate includes a top surface, a bottom surface facing the top surface, and a side surface extending from each of the top surface and the bottom surface. The side surface includes a first side surface extending at a first obtuse angle from the top surface, a second side surface extending at a second obtuse angle from the bottom surface, and a third side surface extending from each of the first side surface and the second side surface. Each of the first obtuse angle and the second obtuse angle is equal to or greater than about 160° and equal to or less than about 170°. A minimum distance between the top surface and the bottom surface is equal to or greater than about 15 μm and equal to or less than about 100 μm.

In an exemplary embodiment, the first obtuse angle may be equal to or greater than about 0.8 times and equal to or less than about 1.2 times of the second obtuse angle.

In an exemplary embodiment, a length of the third side surface in a direction substantially perpendicular to at least one of the top surface and the bottom surface may be equal to or greater than about 0.3 times and equal to or less than about 0.7 times of the minimum distance.

In an exemplary embodiment of the invention, a foldable display device includes a display module, and a glass substrate disposed on the display module, including a folding portion and first and second non-folding portions, which are spaced apart from each other with the folding portion therebetween, and having a thickness equal to or greater than about 15 μm and equal to or less than about 100 μm in a predetermined direction.

In an exemplary embodiment, the glass substrate may include a top surface, a bottom surface facing the top surface, a first inclined surface extending from the top surface, a second inclined surface extending from the bottom surface, and a side surface extending from each of the first inclined surface and the second inclined surface. A length of the side surface in the predetermined direction is equal to or greater than about 0.3 times and equal to or less than about 0.7 times of the thickness.

In an exemplary embodiment, the top surface may be defined as a display surface, and the foldable display device may operate in at least one of a first operation mode, in which a display surface of the first non-folding portion faces a display surface of the second non-folding portion, and a second operation mode, in which the folding portion is folded, and each of the display surface of the first non-folding portion and the display surface of the second non-folding portion is exposed to an outside.

In an exemplary embodiment, the length may be equal to or greater than about 5 µm and equal to or less than about 70 µm.

In an exemplary embodiment, each of the first inclined surface and the second inclined surface may have an inclination angle equal to or greater than about 160° and equal to or less than about 170°.

In an exemplary embodiment, the side surface may be substantially parallel to the predetermined direction of the glass substrate.

In an exemplary embodiment, the display module may include a display element layer, a thin-film encapsulation layer which seals the display element layer, and an input sensing layer directly disposed on the thin-film encapsulation layer.

BRIEF DESCRIPTION OF THE DRAWINGS

The accompanying drawings are included to provide a further understanding of the invention, and are incorporated in and constitute a part of this specification. The drawings illustrate exemplary embodiments of the invention and, together with the description, serve to explain principles of the invention. In the drawings:

FIGS. 6A to 6E are cross-sectional views and a perspective view illustrating an exemplary embodiment of a method for manufacturing a glass substrate;

DETAILED DESCRIPTION

Figure 1A:
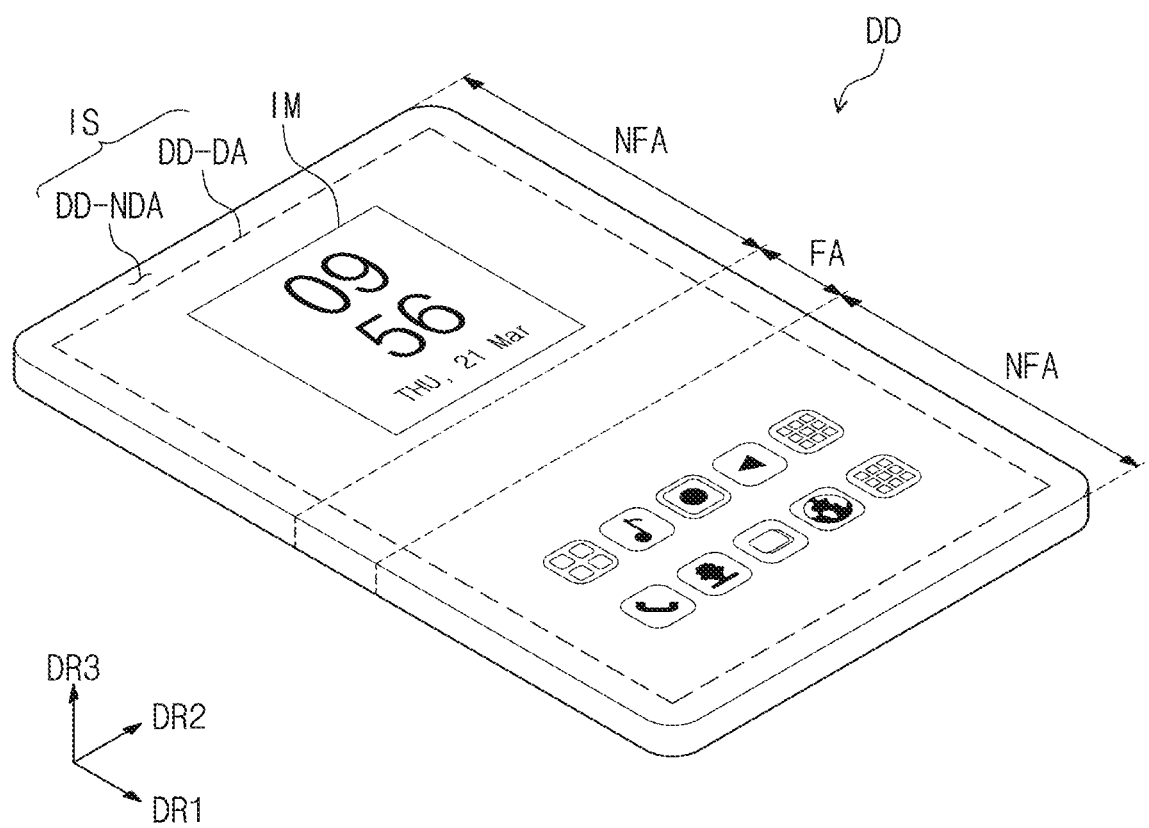
FIG. 1A is a perspective view illustrating an exemplary embodiment of a first operation mode of a display device according to the invention.

In this specification, it will also be understood that when one component (or region, layer, portion) is referred to as being 'on', 'connected to', or 'coupled to' another component, it can be directly disposed/connected/coupled on/to the one component, or an intervening third component may also be present.

Like reference numerals refer to like elements throughout. Also, in the drawing figures, the thickness, ratio, and dimensions of components are exaggerated for clarity of illustration.

The term "and/or" includes any and all combinations of one or more of the associated listed items.

It will be understood that although the terms such as 'first' and 'second' are used herein to describe various elements, these elements should not be limited by these terms. The terms are only used to distinguish one component from other components. A first element referred to as a first element in one embodiment can be referred to as a second element in another exemplary embodiment without departing from the scope of the appended claims, for example. The terms of a singular form may include plural forms unless referred to the contrary.

Also, ""under", "below", "above', "upper", and the like are used for explaining relation association of components illustrated in the drawings. The terms may be a relative concept and described based on directions expressed in the drawings.

Also, in this specification, a structure in which a layer, a film, a region, or a plate is disposed "on" another layer, film, region, or plate may include a structure in which the layer, film, region, or plate is disposed on a lower portion as well as an upper portion of another layer, film, region, or plate.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as generally understood by those skilled in the art. Terms as defined in a commonly used dictionary should be construed as having the same meaning as in an associated technical context, and unless defined apparently in the description, the terms are not ideally or excessively construed as having formal meaning.

The meaning of 'include' or 'comprise' specifies a property, a fixed number, a step, an operation, an element, a component or a combination thereof, but does not exclude other properties, fixed numbers, steps, operations, elements, components or combinations thereof.

Hereinafter, embodiments of the invention will be described with reference to the accompanying drawings.

Figure 1B:
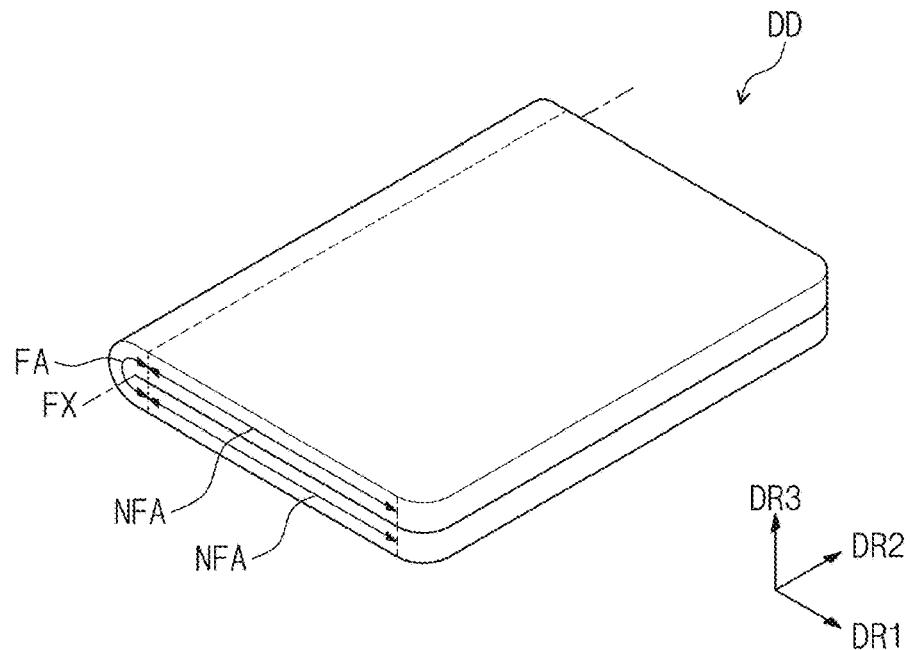
FIG. 1B is a perspective view illustrating an exemplary embodiment of a second operation mode of the display device according to the invention.
Figure 1C:
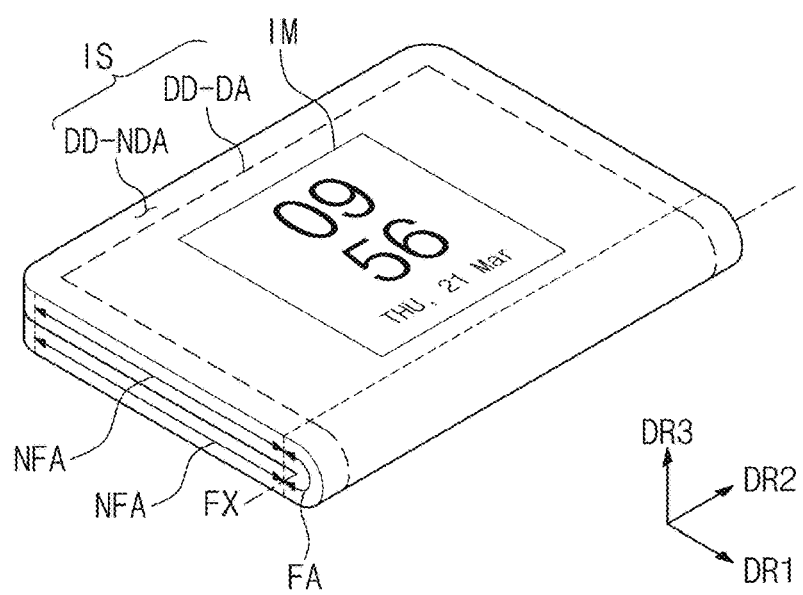
FIG. 1C is a perspective view illustrating an exemplary embodiment of a third operation mode of the display device according to the invention.

FIG. 1A is a perspective view illustrating an exemplary embodiment of a first operation mode of a display device DD according to the invention. FIG. 1B is a perspective view illustrating an exemplary embodiment of a second operation mode of the display device DD according to the invention. FIG. 1C is a perspective view illustrating an exemplary embodiment of a third operation mode of the display device DD according to the invention.

In the first operation mode as illustrated in FIG. 1A, a display surface IS, on which an image IM is displayed, is parallel to a surface defined by a first direction axis DR1 and a second direction axis DR2. A normal direction of the display surface IS, i.e., a thickness direction of the display device DD, indicates a third direction axis DR3. A front surface (or top surface) and a rear surface (or bottom surface) of each of members is distinguished by the third direction axis DR3. However, directions indicated by the first to third direction axes DR1, DR2, and DR3 may be defined as relative concepts and thus converted with respect to each other. Hereinafter, first to third directions may be directions indicated by the first to third direction axes DR1, DR2, and DR3 and designated by the same reference numerals, respectively.

FIGS. 1A to 1C illustrate the foldable display device DD as one example of the flexible display device DD. In an alternative exemplary embodiment, the display device DD may be the rollable or bendable display device DD. However, the invention is not limited thereto. The flexible display device DD in an exemplary embodiment of the invention may be used for large-sized electronic devices such as televisions and monitors and small and medium-sized electronic devices such as mobile phones, tablet personal computers ("PCs"), navigation units for vehicles, game consoles, and smart watches. Hereinafter, the display device DD will be described as the foldable display device DD.

As illustrated in FIG. 1A, the display surface IS of the display device DD may include a plurality of areas. The display device DD includes a display area DD-DA, on which an image IM is displayed, and a non-display area DD-NDA disposed adjacent to the display area DD-DA. The non-display area DD-NDA may be an area on which an image is not displayed. FIG. 1A illustrates a clock widget as an example of the image IM. In an exemplary embodiment, the display area DD-DA may have a quadrangular (e.g., rectangular) shape, for example. However, the invention is not limited thereto, and the display area DD-DA may include various other shapes. The non-display area DD-NDA may surround the display area DD-DA. However, the invention is not limited thereto. In an exemplary embodiment, the display area DD-DA and the non-display area DD-NDA may have relatively designed shapes. In another exemplary embodiment, the non-display area DD-NDA may be omitted, for example.

As illustrated in FIGS. 1A to 1C, the display device DD may include a plurality of areas defined according to an operation type. The display device DD may include a folding area FA, which is folded on the basis of a folding axis FX, and a non-folding area NFA, which is not folded. Although the display device DD includes one folding area FA and two non-folding areas NFA in FIGS. 1A to 1C, the invention is not limited thereto. In an exemplary embodiment, the display device DD may include one folding area FA and one non-folding area NFA, for example. In an alternative exemplary embodiment, the display device may include three or more non-folding areas NFA and two folding areas FA, and here two or more folding axes FX may be defined.

As illustrated in FIG. 1B, the display device DD may be in-folded so that the display surfaces IS of the two non-folding areas NFA face each other. As illustrated in FIG. 1C, the display device DD may be out-folded so that the display surfaces IS are exposed to the outside.

Although only one folding area FA is exemplarily illustrated in FIGS. 1A to 1C, the invention is not limited thereto. In an exemplary embodiment of the invention, the display device DD may include a plurality of folding areas FA, for example. In an exemplary embodiment of the invention, the display device DD may operate in at least one of operation modes in FIGS. 1A and 1B. The display device DD may repeat only the operation modes in FIGS. 1A and 1B. However, the invention is not limited thereto. In an exemplary embodiment, the folding area FA may be variously defined in correspondence to user operating types of the display device DD, for example. In an exemplary embodiment, the folding areas FA may be defined in parallel to the first directional axis DR1 or defined in a diagonal direction, unlike the illustrated exemplary embodiments of FIGS. 1B and 1C, for example.

When the display device DD includes the two non-folding areas NFA, the non-folding areas NFA may have the same area as each other. However, the invention is not limited thereto. The non-folding area NFA may have an area greater than that of the folding area FA. In an exemplary embodiment, the area of the folding area FA may not be fixed but be determined according to a curvature radius.

Figure 2:
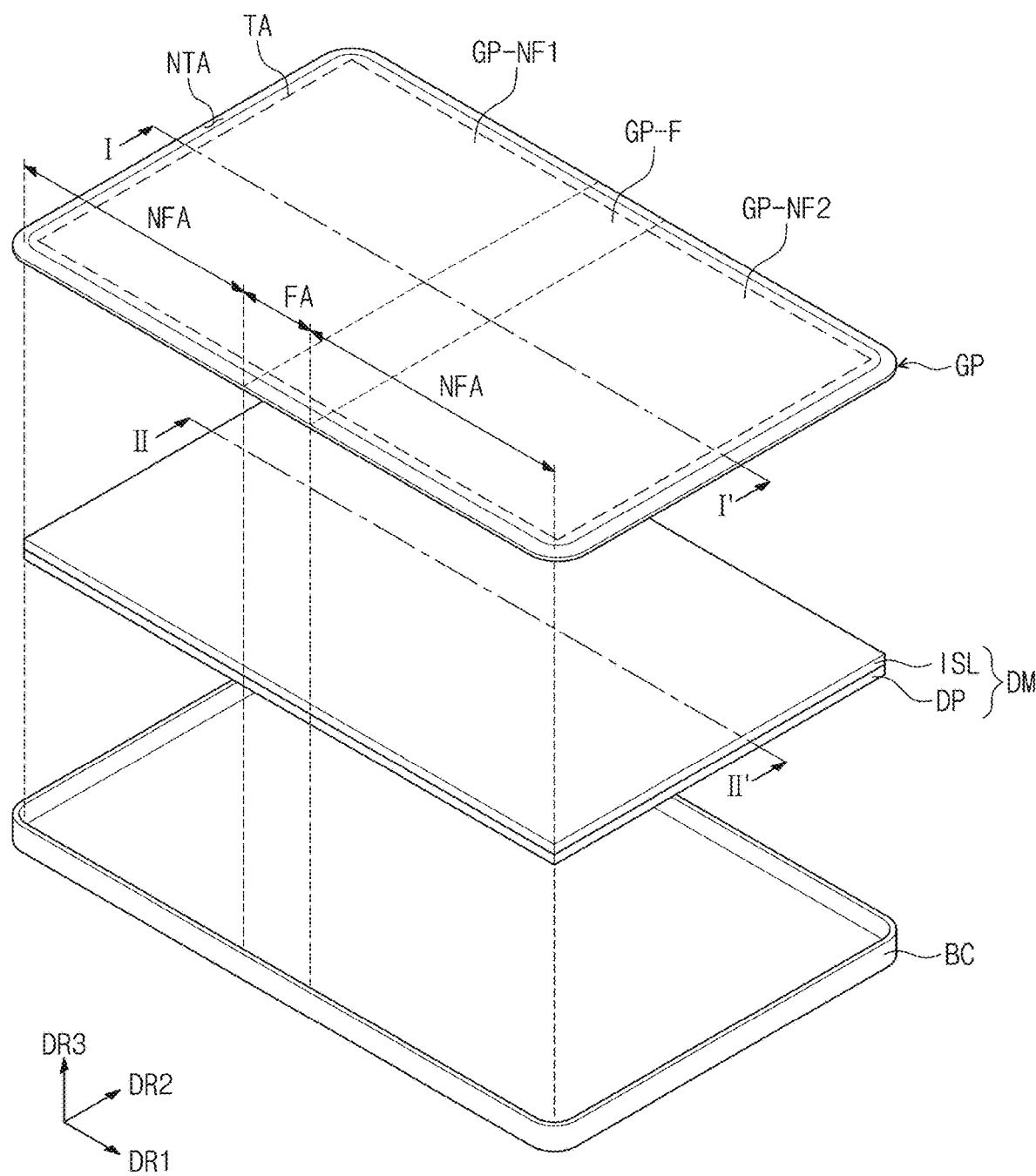
FIG. 2 is an exploded perspective view illustrating an exemplary embodiment of the display device according to the invention.

FIG. 2 is an exploded perspective view illustrating an exemplary embodiment of the display device DD according to the invention.

Referring to FIG. 2, the display device DD may include a glass substrate GP, a display module DM, and an accommodation member BC.

The glass substrate GP may be disposed on the display module DM and transmit an image, which is provided from the display module DM, to the outside. The glass substrate GP includes a transmission area TA and a non-transmission area NTA. The transmission area TA may overlap the display area DD-DA and have a shape corresponding to the display area DD-DA. The image IM displayed on the display area DD-DA of the display device DD may be seen from the outside through the transmission area TA of the glass substrate GP.

The non-transmission area NTA may overlap the non-display area DD-NDA and have a shape corresponding to the non-display area DD-NDA. The non-transmission area NTA may have a relatively lower light transmittance than that of the transmission area TA. However, the invention is not limited thereto. In another exemplary embodiment, the non-transmission area NTA may be omitted, for example.

The glass substrate GP may include a folding portion GP-F and non-folding portions GP-NF1 and GP-NF2. The folding portion GP-F of the glass substrate GP may correspond to the folding area FA of the display device DD. The non-folding portions GP-NF1 and GP-NF2 of the glass substrate GP may correspond to the non-folding area NFA of the display device DD. The folding portion GP-F may be folded when the above-described operation modes are executed. Thus, the non-folding portions GP-NF1 and GP-NF2 may not be folded when the above-described operation modes are executed. Referring to FIG. 2, although the non-folding portions GP-NF1 and GP-NF2 include a first non-folding portion GP-NF1 and a second non-folding portion GP-NF2, which are spaced apart from each other with the folding portion GP-F therebetween, the invention is not limited thereto. The number or shape of the folding portion GP-F and the non-folding portions GP-NF1 and GP-NF2 may be variously changed in correspondence to the folding area FA and the non-folding area NFA.

The display module DM is disposed between the glass substrate GP and the accommodation member BC. The display module DM may include a display panel DP and an input sensing layer ISL disposed on the display panel DP. The display panel DP may generate an image and transmit the generated image to the glass substrate GP. In an exemplary embodiment of the invention, the display panel DP may be a light emitting display panel. However, the invention is not limited to the kind of the display panel. In an exemplary embodiment, the display panel DP may be an organic light emitting display panel or a quantum dot light emitting display panel, for example. The organic light emitting display panel may include a light emitting layer including an organic light emitting material. The quantum dot light emitting display panel may include a light emitting layer including a quantum dot or a quantum rod. Hereinafter, the display panel DP in an exemplary embodiment may be described as the organic light emitting display panel.

The input sensing layer ISL may be disposed between the glass substrate GP and the display panel DP. As illustrated in FIG. 2, the input sensing layer ISL may overlap an entirety of the transmission area TA. However, in an exemplary embodiment of the invention, the input sensing layer ISL may overlap a portion of the transmission area TA or overlap only the non-transmission area NTA. The input sensing layer ISL may detect an input applied from the outside. The input applied from the outside may be provided in various types. In an exemplary embodiment, the external input includes various types of external inputs such as a portion of a user's body, a stylus pen, light, heat, or pressure, for example. Also, in addition to a contact input generated by a portion of the user's body such as user's hands, a space touch (e.g., hovering) generated by being approached or adjacent may be one type of the inputs.

The input sensing layer ISL may detect an external input and acquire coordinate information of the external input. The input sensing layer ISL in an exemplary embodiment of the invention may detect a variation of a capacitance caused by an external object to detect an external input. That is, the input sensing layer ISL in an exemplary embodiment may be a capacitive input sensor.

The accommodation member BC may accommodate the display module DM. Although not shown, the accommodation member BC may include a hinge. The hinge may be provided at a portion, which overlaps the folding area FA, of the accommodation member BC. In another exemplary embodiment, the accommodation member BC may be omitted.

Figure 3A:
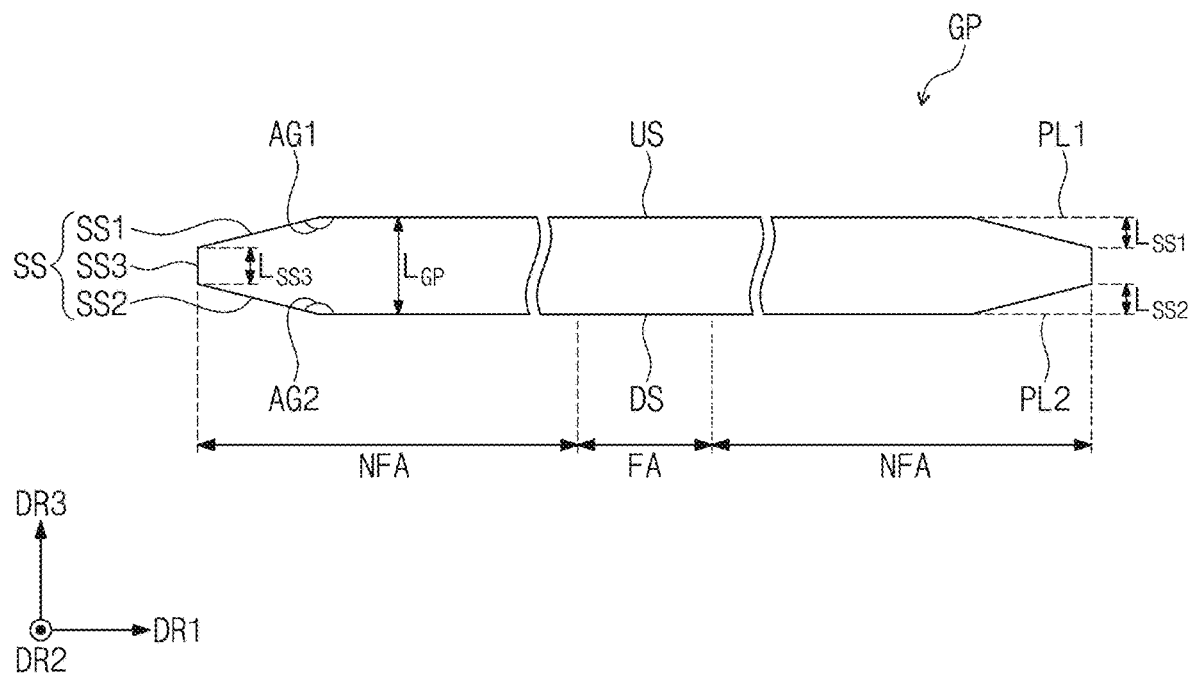
FIG. 3A is a cross-sectional view illustrating a glass substrate and taken along line I-I' of FIG. 2.
Figure 3B:
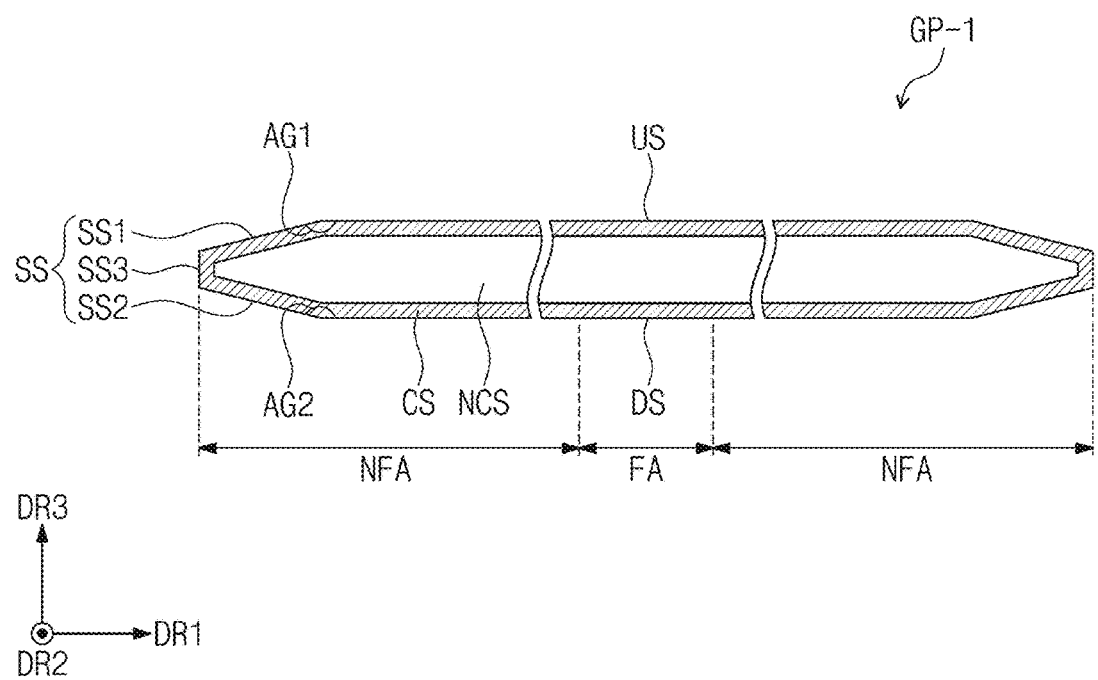
FIG. 3B is a cross-sectional view illustrating an exemplary embodiment of the glass substrate according to the invention.

FIG. 3A is a cross-sectional view illustrating an exemplary embodiment of a glass substrate and taken along line I-I' of FIG. 2. FIG. 3B is a cross-sectional view illustrating an exemplary embodiment of the glass substrate according to the invention.

Referring to FIG. 3A, the glass substrate in an exemplary embodiment may include a top surface US, a bottom surface DS, and a side surface SS. The top surface US and the bottom surface DS may face each other. The top surface US and the bottom surface DS may be substantially parallel to each other.

In this specification, a phrase "substantially parallel" may represent a feature of being parallel within a range including errors that may be generated during a process. Even when one surface and/or the other surface has slight curve that may be generated during a process or has a slight inclination difference (e.g., a slight inclination of about 1 degree (°)) therebetween, the one surface and the other surface may be defined by being "substantially parallel", for example. Hereinafter, in this specification, a term "substantially" has the same meaning as defined in the phrase "substantially parallel", for example.

In an exemplary embodiment, a minimum distance $L_{GP}$ between the top surface US and the bottom surface DS may be in a range from about 15 micrometer (μm) to about 100 μm, for example. That is, the thickness $L_{GP}$ of the glass substrate GP in an exemplary embodiment may be in a range from about 15 μm to about 100 μm, for example. As the glass substrate GP in an exemplary embodiment has the thickness in the range from about 15 μm to about 100 μm, for example, the first operation mode and the second operation mode may smoothly operate.

The side surface SS may extend from each of the top surface US and the bottom surface DS. The side surface SS may include a first side surface SS1, a second side surface SS2, and a third side surface SS3. The first side surface SS1 may extend from the top surface US. The second side surface SS2 may extend from the bottom surface DS.

Each of the first side surface SS1 and the second side surface SS2 may be an inclined surface. The first side surface SS1 may extend while being inclined at a first angle AG1 with respect to the top surface US. The second side surface SS2 may extend while being inclined at a second angle AG2 with respect to the bottom surface DS. Each of the first angle AG1 and the second angle AG2 may be an obtuse angle. In an exemplary embodiment, each of the first angle AG1 and the second angle AG2 may be in a range from about 160° to about 170°, for example. In an exemplary embodiment, the first angle AG1 may be equal to or greater than about 0.8 times and equal to or less than about 1.2 times of the second angle AG2, for example.

When the first angle AG1 and the second angle AG2 satisfy the above-described condition, the glass substrate GP in an exemplary embodiment may have an excellent bending strength and an improved durability with respect to an impact applied from the side surface. Detailed descriptions will be described later.

Each of the first side surface SS1 and the second side surface SS2 may be a straight line. However, the invention is not limited thereto. Each of the first side surface SS1 and the second side surface SS2 may include a curve.

The third side surface SS3 may extend from each of the first side surface SS1 and the second side surface SS2. In an exemplary embodiment, the third side surface SS3 may have a length $L_{SS3}$ which is equal to or greater than about 0.3 times and equal to or less than about 0.7 times of the thickness of the glass substrate GP in a normal direction of the top surface US or the bottom surface DS, for example. In an exemplary embodiment, the length $L_{SS3}$ of the third side surface SS3 may be equal to or greater than about 5 μm and equal to or less than about 70 μm, for example. The third side surface SS3 may be substantially perpendicular to the top surface US and the bottom surface DS. However, the invention is not limited thereto. The third side surface SS3 may include a curve.

In an exemplary embodiment, when the thickness $L_{GP}$ of the glass substrate GP is equal to or greater than about 70 μm and equal to or less than about 100 μm, the length $L_{SS3}$ of the third side surface SS3 may be equal to or greater than about 0.5 times and equal to or less than about 0.7 times of the thickness $L_{GP}$ of the glass substrate GP, for example. In an exemplary embodiment, the thickness $L_{GP}$ of the glass substrate GP may be in a range from about 35 μm to about 70 μm, for example.

In an exemplary embodiment, when the thickness $L_{GP}$ of the glass substrate GP is equal to or greater than about 40 μm and equal to or less than about 70 μm, the length $L_{SS3}$ of the third side surface SS3 may be equal to or greater than about 0.4 times and equal to or less than about 0.6 times of the thickness $L_{GP}$ of the glass substrate GP, for example. In an exemplary embodiment, the thickness $L_{GP}$ of the glass substrate GP may be in a range from about 16 μm to about 42 μm, for example.

In an exemplary embodiment, when the thickness $L_{GP}$ of the glass substrate GP is equal to or greater than about 15 μm and equal to or less than about 40 μm, the length $L_{SS3}$ of the third side surface SS3 may be equal to or greater than about 0.3 times and equal to or less than about 0.5 times of the thickness $L_{GP}$ of the glass substrate GP, for example. In an exemplary embodiment, the thickness $L_{GP}$ of the glass substrate GP may be in a range from about 4.5 μm to about 20 μm, for example.

That is, as the thickness $L_{GP}$ of the glass substrate GP decreases, a ratio of the length $L_{SS3}$ of the third side surface SS3 to the thickness $L_{GP}$ of the glass substrate GP may decrease. When the length $L_{SS3}$ of the third side surface SS3 satisfies the above-described condition, the glass substrate GP in an exemplary embodiment may have an excellent bending strength and an improved durability with respect to an impact applied from the side surface. Detailed descriptions will be described later.

Referring to FIG. 3A, a first plane PL1 extending from and parallel to the top surface US and a second plane PL2 extending from and parallel to the bottom surface DS are defined. In an exemplary embodiment, a minimum distance $L_{SS1}$ between the third side surface SS3 and the first plane PL1 may be equal to or greater than about 0.9 times and equal to or less than about 1.1 times of the minimum distance $L_{SS2}$ of the second plane PL2, for example.

In this specification, the first side surface SS1 may be also referred to as a first inclined surface SS1, and the second side surface SS2 may be also referred to as a second inclined surface SS2. In this specification, the first angle AG1 may be also referred to as a first inclination angle AG1, and the second angle AG2 may be also referred to as a second inclination angle AG2. In this specification, when the first side surface SS1 is referred to as the first inclined surface SS1, and the second side surface SS2 is referred to as the second inclined surface SS2, the third side surface SS3 may be also referred to as a side surface SS3.

In an exemplary embodiment, the glass substrate GP may include $SiO_2$. In an exemplary embodiment, the glass substrate GP may further include at least one of $Al_2O_3$, $Li_2O$, $Na_2O$, $K_2O$, MgO, and CaO, for example. In an exemplary embodiment, the glass substrate GP may further include at least one of $Fe_2O_3$, ZnO, $TiO_2$, $P_2O_5$, etc., for example.

FIG. 3B is a cross-sectional view illustrating an exemplary embodiment of a glass substrate GP-1. FIG. 3B is a view illustrating a cross-section corresponding to that of the glass substrate GP in FIG. 3A. Referring to FIG. 3B, the glass substrate GP-1 in an exemplary embodiment may include a reinforced area CS and a non-reinforced area NCS.

The reinforced area CS may have a compressive stress greater than that of the non-reinforced area NCS. The reinforced area CS may include a first alkali metal cation, and the non-reinforced area NCS may include a second alkali metal cation having an ion radius greater than that of the first alkali metal cation. In an exemplary embodiment, the first alkali metal cation may include at least one of Na+, K+, Rb+, and Cs+, for example. In an exemplary embodiment, the second alkali metal cation may include at least one of Li+, Na+, K+, and Rb+, for example. In an exemplary embodiment, the first alkali metal cation may be K+, and the second alkali metal cation may be Na+, for example. Since the reinforced area CS includes the alkali metal cation having an ion radius greater than that of the alkali metal cation of the non-reinforced area NCS, the reinforced area CS may have a compressive stress greater than that of the non-reinforced area NCS.

A concentration of the first alkali metal cation in the reinforced area CS may gradually decrease in a direction adjacent to the non-reinforced area NCS. Thus, the compressive stress of the reinforced area CS may have a value that gradually increases in a direction adjacent to a top surface US or a bottom surface DS and gradually decreases in a direction adjacent to the non-reinforced area NCS. The reinforced area CS may have a constant compression depth in the glass substrate GP. The glass substrate may have a negative (−) compressive stress value at a depth equal to or greater than the compression depth. That is, the non-reinforced area NCS may be an area having a negative compressive stress value. In an exemplary embodiment, the compression depth of the glass substrate GP may be equal to or greater than about 10 percent (%) or equal to or greater than about 20% of the thickness $L_{GP}$ of the glass substrate GP, for example.

In this specification, an average minimum distance from the top surface US or the bottom surface DS of the glass substrate GP to an area at which the compressive stress value is about 0 may be defined as the compression depth.

The reinforced area CS may be provided to cover the non-reinforced area NCS. That is, the reinforced area CS may be provided over an entire surface of the glass substrate GP. The glass substrate GP may have a high surface strength by including the reinforced area CS covering the glass substrate GP. Thus, the glass substrate GP in an exemplary embodiment may have a strong durability against an impact. As illustrated in FIG. 3B, the reinforced area CS and the non-reinforced area NCS may be integrated with each other.

Hereinafter, the display module DM in an exemplary embodiment will be described in detail with reference to FIGS. 4 and 5.

Figure 4:
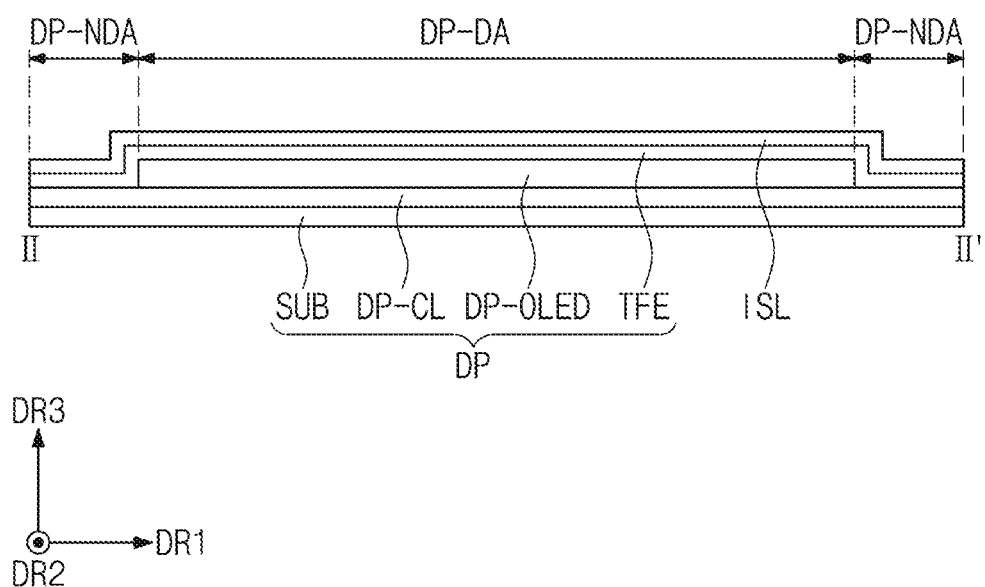
FIG. 4 is a cross-sectional view illustrating a display module and taken along line II-II' of FIG. 2.

FIG. 4 is a cross-sectional view illustrating the display module and taken along line II-II' of FIG. 2. FIG. 5 is a cross-sectional view illustrating an exemplary embodiment of a display panel according to the invention.

Figure 5:
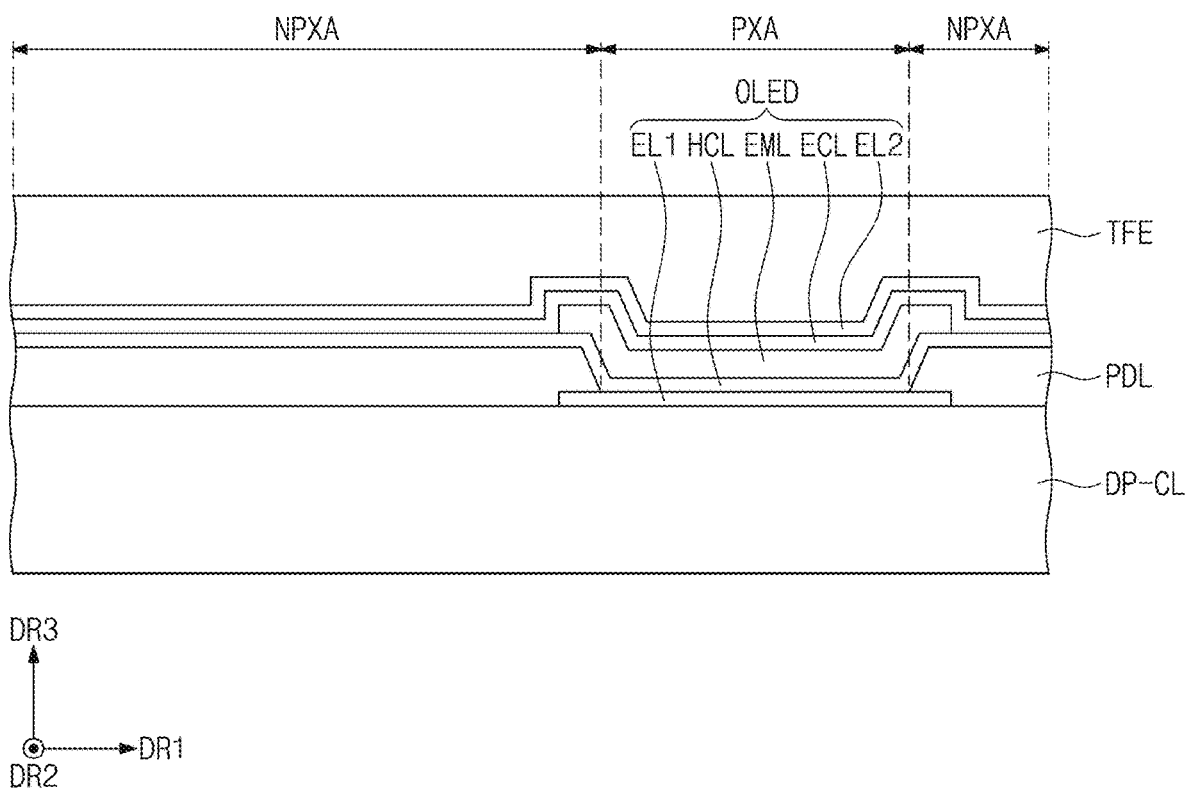
FIG. 5 is a cross-sectional view illustrating an exemplary embodiment of a display panel according to the invention.

Referring to FIGS. 4 and 5, the display panel DP includes a substrate SUB, a circuit element layer DP-CL, a display element layer DP-OLED, and a thin-film encapsulation layer TFE.

The display panel DP includes a display area DP-DA and a non-display area DP-NDA. The display area DP-DA of the display panel DP corresponds to the display area DD-DA in FIGS. 1A to 1C or the transmission area TA in FIG. 2, and the non-display area DP-NDA corresponds to the non-display area DD-NDA in FIGS. 1A to 1C or the non-transmission area NTA in FIG. 2.

The substrate SUB may include at least one plastic film. The substrate SUB that is a flexible substrate may include a plastic substrate, a glass substrate, a metal substrate, or an organic/inorganic composite substrate. The substrate SUB may include a synthetic resin film. The synthetic resin layer may include a thermosetting resin. The substrate SUB may have a multilayer structure. In an exemplary embodiment, the substrate SUB may have a three-layer structure of a synthetic resin layer, an adhesive layer, and a synthetic resin layer, for example. Particularly, the synthetic resin layer may include a polyimide-based resin layer. However, the invention is not limited to the material of the synthetic resin layer. The synthetic resin layer may include at least one of an acrylic-based resin, a methacrylic-based resin, a polyisoprene-based resin, a vinyl-based resin, an epoxy-based resin, a urethane-based resin, a cellulose-based resin, a siloxane-based resin, a polyamide-based resin, or a perylene-based resin. Besides, the substrate SUB may include a glass substrate, a metal substrate, or an organic/inorganic composite substrate.

The circuit element layer DP-CL may include at least one intermediate insulation layer and a circuit element. The intermediate insulation layer includes at least one intermediate inorganic layer and at least one intermediate organic layer. The circuit element may include signal lines, a driving circuit of a pixel, etc.

The display element layer DP-OLED may include an organic light emitting diode OLED. The organic light emitting diode OLED may include a first electrode EL1, a hole transport layer HCL, a light emitting layer EML, an electron transport layer ECL, and a second electrode EL2. The first electrode EL1 may be an anode. Also, the first electrode EL1 may be a pixel electrode. Although the light emitting layer EML may include an organic light emitting material, the invention is not limited thereto. In an exemplary embodiment, the light emitting layer EML may include an inorganic light emitting material such as a quantum dot or a quantum rod. The second electrode EL2 may be a common electrode or a cathode.

The organic light emitting diode OLED may further include a capping layer disposed on the second electrode EL2. The capping layer may protect the organic light emitting diode OLED or adjust optical characteristics.

The display element layer DP-OLED may further include an organic layer such as a pixel defining layer PDL. The pixel defining layer PDL may be disposed on the circuit element layer DP-CL to expose at least a portion of the first electrode EL1. The pixel defining layer PDL may define a light emitting area PXA and a non-light emitting area NPXA adjacent to the light emitting area PXA.

The thin-film encapsulation layer TFE seals the display element layer DP-OLED. The thin-film encapsulation layer TFE may be directly disposed on the organic light emitting element OLED. In an exemplary embodiment, the thin-film encapsulation layer TFE may be directly disposed on the second electrode EL2, for example. In an alternative exemplary embodiment, when the organic light emitting element OLED further includes a capping layer (not shown), the thin-film encapsulation layer TFE may be directly disposed on the capping layer. The thin-film encapsulation layer TFE may include at least one organic layer and at least one inorganic layer. In an exemplary embodiment, the thin-film encapsulation layer TFE may include a laminated structure of an inorganic layer/organic layer/inorganic layer, for example. The thin-film encapsulation layer TFE may protect the display element layer DP-OLED from moisture, oxygen, and foreign substances such as dust particles.

The input sensing layer ISL may be disposed on the display panel DP. Although not shown, the input sensing layer ISL may include an insulation layer and a conductive layer. In an exemplary embodiment, a base insulation layer (not shown) may be disposed below the input sensing layer ISL. The base insulation layer may be an inorganic insulation layer.

The input sensing layer ISL and the display panel DP may be manufactured through a continuous process. The input sensing layer ISL may be directly disposed on the display panel DP. In this specification, an expression "a component A is directly disposed on a component B" represents that the component A contacts the component B without an adhesive layer therebetween.

FIGS. 6A to 6E are cross-sectional views and a perspective view illustrating an exemplary embodiment of a method for manufacturing the glass substrate GP. In describing an exemplary embodiment of the invention with reference to FIGS. 6A to 6E, the same component as that described above will be designated by the same reference numeral, and detailed description thereof will be omitted.

Figure 6A:
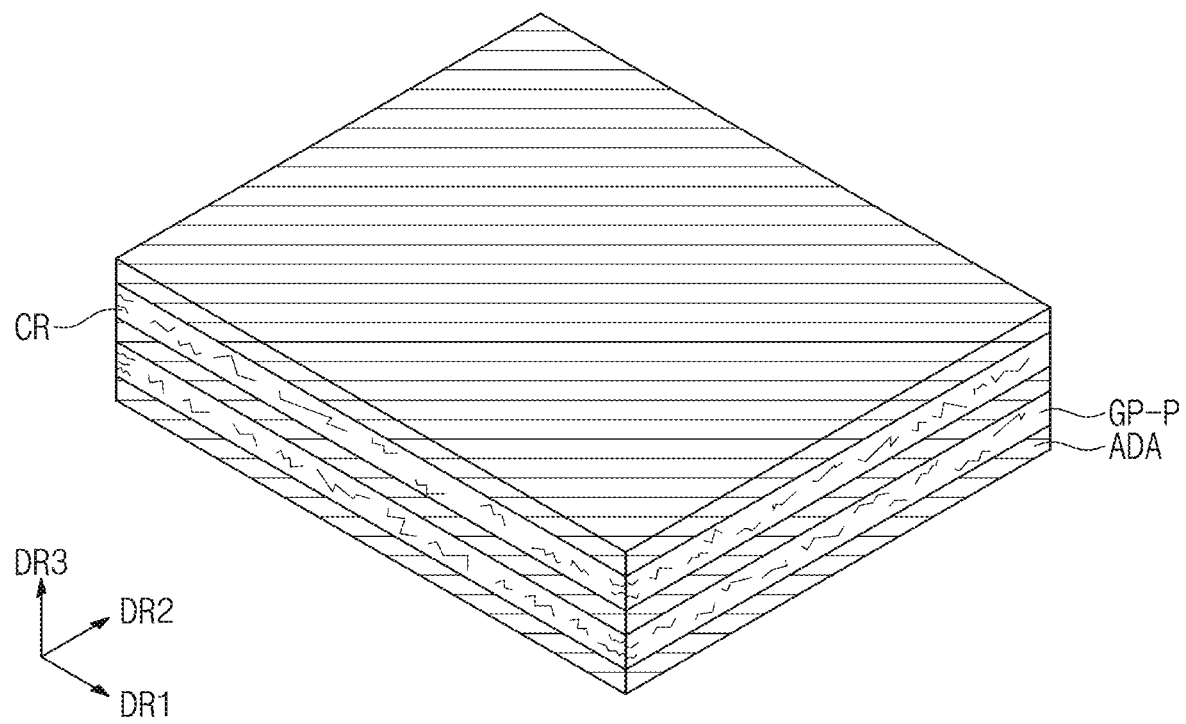
Figure 6B:
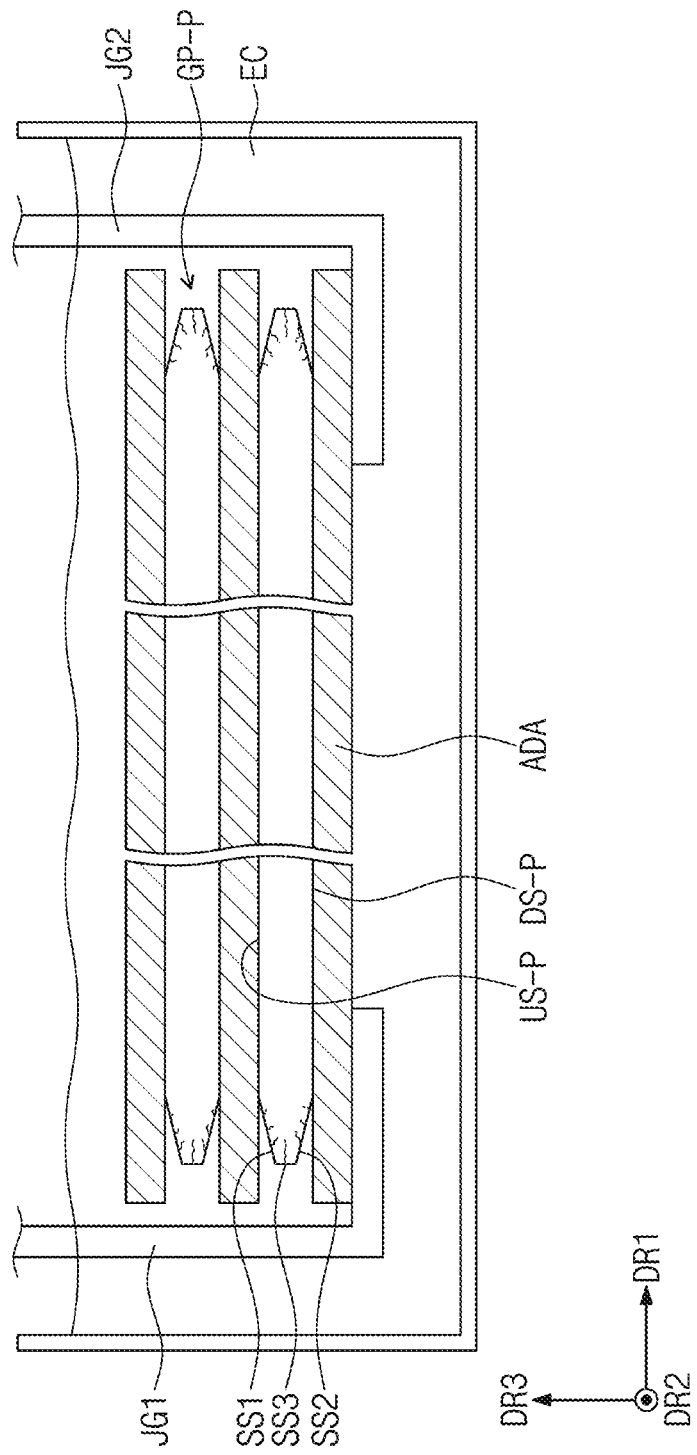
Figure 6D:
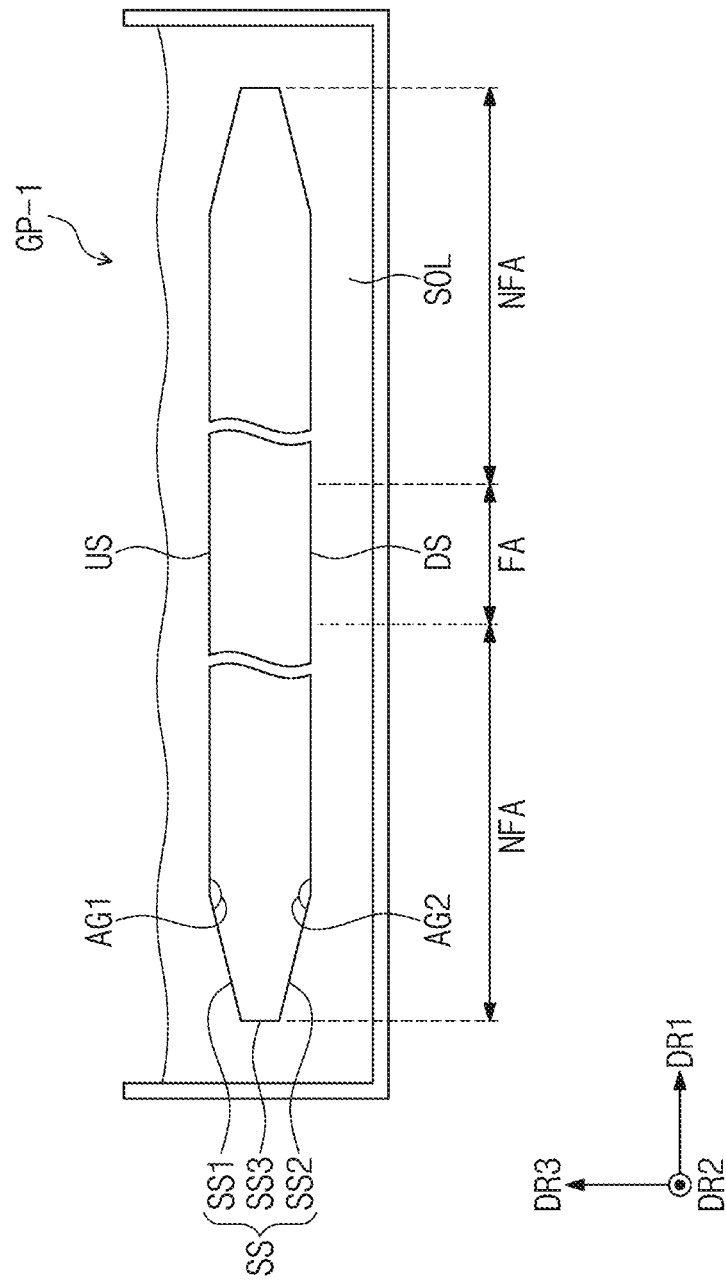
Figure 6E:
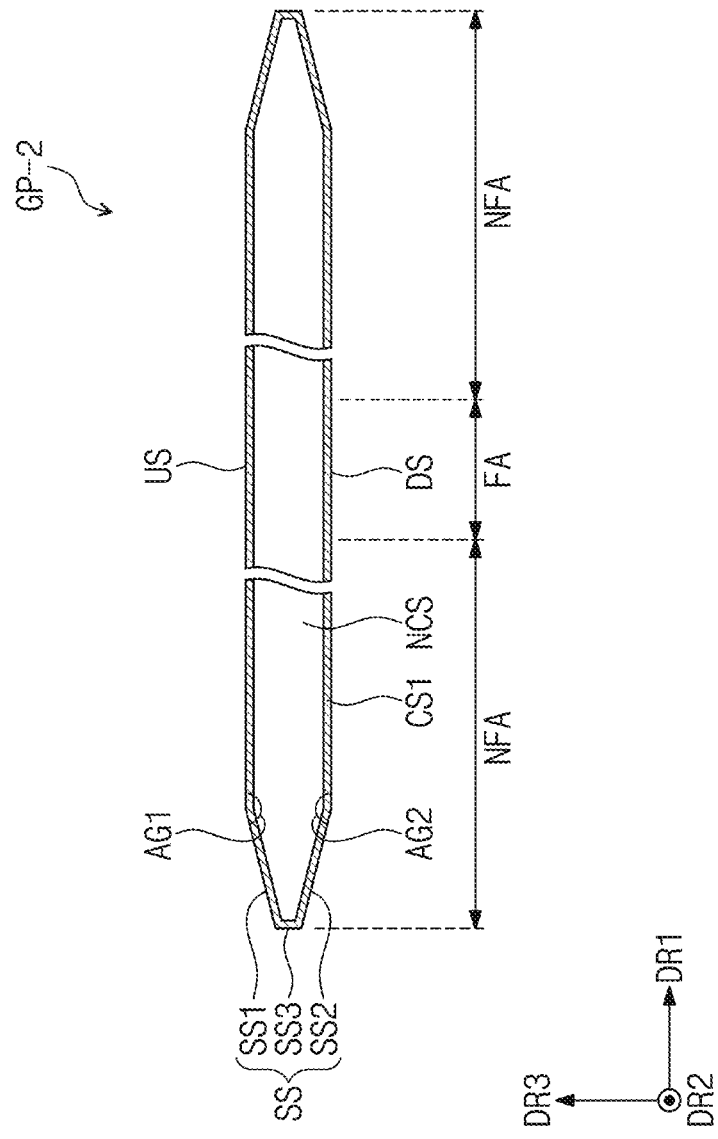

FIG. 6A is a perspective view illustrating an exemplary embodiment of a process of providing a base glass substrate GP-P. FIG. 6B is a cross-sectional view illustrating a process of etching a cross-section. FIG. 6C is a cross-sectional view illustrating an exemplary embodiment of a glass substrate GP manufactured through the process of etching the cross-section. FIG. 6D is a cross-sectional view illustrating an exemplary embodiment of a glass substrate GP-1 manufactured through a chemical strengthening process. FIG. 6E is a cross-sectional view illustrating an exemplary embodiment of a glass substrate GP-2 manufactured through a front side etching process.

Referring to FIG. 6A, the method for manufacturing the glass substrate GP in an exemplary embodiment may include a process of providing the base glass substrate GP-P. The base glass substrate GP-P may be provided in plurality and laminated with each other. Although two base glass substrates GP-P are exemplarily laminated in FIG. 6A, the invention is not limited thereto. Three or more laminated base glass substrates GP-P may be provided, or only one base glass substrate GP-P may be provided.

Here, an adhesive layer ADA may be provided between the base glass substrates GP-P and on an exposed surface of the base glass substrate GP-P in order to prevent a damage that may be generated when the base glass substrate GP-P is transferred. The adhesive layer ADA may be provided as an adhesive tape or an adhesive resin. However, the invention is not limited thereto. The adhesive layer ADA may serve as a protection layer preventing a damage that may be generated on a surface of the base glass substrate GP-P.

The base glass substrate GP-P may be physically cut from a glass circular plate. In a process of physically cutting the glass circular plate, a crack CR may be generated in a cut surface, or a portion of the cut surface may be broken and separated. As described above, the cut surface of the base glass substrate GP-P may be damaged in the process of cutting the glass circular plate, and thus a bending strength of the base glass substrate GP-P may be reduced. Thus, a limitation, in which the base glass substrate GP-P is easily damaged when folded, may be generated. However, the base glass substrate GP-P in an exemplary embodiment undergoes the process of etching the cross-section (refer to FIG. 6B), a damaged portion of the base glass substrate GP-P may be removed. Thus, the above-described limitation may be relieved or prevented.

Referring to FIG. 6A, the method for manufacturing the glass substrate GP in an exemplary embodiment may include a process of etching a cross-section of the base glass substrate GP-P. The process of etching the cross-section of the base glass substrate GP-P may include a process of wet-etching the base glass substrate GP-P. The base glass substrate GP-P may be etched by a dip method. In an exemplary embodiment, the glass substrate may be fixed by jigs JG1 and JG2 and dipped into an etching solution EC. However, the invention is not limited thereto. In an exemplary embodiment, the etching solution EC may include an acid, additives, a surfactant, and distilled water, for example.

In an exemplary embodiment, the acid may include a mineral acid or an organic acid, e.g., a hydrofluoric acid, a phosphoric acid, a nitric acid, an acetic acid, a sulfuric acid, and ammonium bifluoride, for example. The additives may be inhibotors that are added for uniform etching. In an exemplary embodiment, the jigs JG1 and JG2 may adjust an etching rate of the base glass substrate GP-P through rotation.

As illustrated in FIG. 6B, when the base glass substrate GP-P is dip-etched, a top surface US-P and a bottom surface DS-P of the base glass substrate GP-P may be etched at a predetermined taper angle. Thus, the base glass substrate GP-P may be etched such that the cross-section thereof has a C-shape or a shape obtained by rotating a trapezoid at about 90°.

Referring to FIGS. 6B and 6C, the base glass substrate GP-P may be etched to form a taper angle of about 10° or more and about 20° or less. Also, in the process of etching the cross-section of the base glass substrate GP-P, the base glass substrate GP-P may be etched so that the length $L_{SS3}$ of the third side surface SS3 is equal to or greater than about 0.3 times and equal to or less than about 0.7 times of the thickness of the glass substrate GP.

When the taper angle of the glass substrate GP is greater than about 20°, the length $L_{SS3}$ of the third side surface SS3 may be short. The length $L_{SS3}$ (refer to FIG. 3A) of the third side surface SS3 may be less than about 0.3 times of the thickness of the glass substrate GP, for example. When the length $L_{SS3}$ of the third side surface SS3 is less than about 0.3 times of the thickness of the glass substrate GP, the glass substrate GP may be easily damaged by an impact applied from the side surface thereof.

When the taper angle of the glass substrate GP is less than about 10°, lengths of the first side surface SS1 and the second side surface SS2 may be long. Thus, a ratio of the inclined surface in the glass substrate GP to a flat surface in the glass substrate GP may increase. Also, since a time desired for etching the glass substrate GP may increase, a process efficiency may be reduced.

Since the taper angle of the glass substrate GP in an exemplary embodiment is equal to or greater than about 10° and equal to or less than about 20° (i.e., each of the first angle AG1 and the second angle AG2 is equal to or greater than about 160° and equal to or less than about 170°), a strong durability and an excellent process efficiency may be achieved.

The taper angle may be adjusted so that the first angle AG1 is equal to or greater than about 0.8 times and equal to or less than about 1.2 times of the second angle AG2. When a difference between the first angle AG1 and the second angle AG2 increases, upper and lower portions of the glass substrate GP may be differently etched. Thus, one of the upper and lower portions may be over-etched or under-etched.

When the taper angle is adjusted so that the first angle AG1 is equal to or greater than about 0.8 times and equal to or less than about 1.2 times of the second angle AG2, the minimum distance $L_{SS1}$ between the third side surface SS3 and the first plane PL1 (refer to FIG. 3A) may have a similar value (e.g., equal to or greater than about 0.9 times or equal to or less than about 1.1 times) to that of the minimum distance $L_{SS2}$ (refer to FIG. 3A) between the third side surface SS3 and the second plane PL2 to prevent the phenomenon in which one of the upper and lower portions is over-etched or under-etched.

When the length $L_{SS3}$ of the third side surface SS3 is less than about 0.3 times of the thickness $L_{GP}$ (refer to FIG. 3A) of the glass substrate GP, an edge portion may have a low bending strength because of an excessively small thickness thereof. Also, the glass substrate may be easily damaged by an impact applied from the outside. Particularly, the edge portion may be easily damaged by an impact applied from the side surface of the glass substrate GP.

When the length $L_{SS3}$ of the third side surface SS3 is greater than about 0.7 times of the thickness $L_{GP}$ of the glass substrate GP, the crack CR generated in the cross-section of the base glass substrate GP-P may not be completely removed or the curvedness may not be sufficiently flattened. Thus, the glass substrate may have a low bending strength.

The method for manufacturing the glass substrate GP in an exemplary embodiment adjusts the length $L_{SS3}$ of the third side surface SS3 to be equal to or greater than about 0.3 times and equal to or less than about 0.7 times of the thickness $L_{GP}$ of the glass substrate GP in the process of etching the cross-section. Thus, the glass substrate GP in an exemplary embodiment may have a substantially high bending strength and a substantially excellent durability against an external impact.

In the process of etching the cross-section in an exemplary embodiment, when the thickness $L_{GP}$ of the glass substrate GP is equal to or greater than about 70 μm and equal to or less than about 100 μm, the etching may be performed so that the length $L_{SS3}$ of the third side surface SS3 is equal to or greater than about 0.5 times and equal to or less than about 0.7 times of the thickness $L_{GP}$ of the glass substrate GP. In an exemplary embodiment, the glass substrate GP may be etched to have the thickness $L_{GP}$ in a range from about 35 μm to about 70 μm, for example.

When the thickness $L_{GP}$ of the glass substrate GP is equal to or greater than about 40 μm and equal to or less than about 70 μm, the etching may be performed so that the length $L_{SS3}$ of the third side surface SS3 is equal to or greater than about 0.4 times and equal to or less than about 0.6 times of the thickness $L_{GP}$ of the glass substrate GP. In an exemplary embodiment, the glass substrate GP may be etched to have the thickness $L_{GP}$ in a range from about 16 μm to about 42 μm, for example.

When the thickness $L_{GP}$ of the glass substrate GP is equal to or greater than about 15 μm and equal to or less than about 40 μm, the etching may be performed so that the length $L_{SS3}$ of the third side surface SS3 is equal to or greater than about 0.3 times and equal to or less than about 0.5 times of the thickness $L_{GP}$ of the glass substrate GP. In an exemplary embodiment, the glass substrate GP may be etched to have the thickness $L_{GP}$ in a range from about 4.5 μm to about 20 μm, for example.

When the base glass substrate GP-P has a small thickness, a ratio of a removed portion of the base glass substrate GP-P to a remaining portion of the base glass substrate GP-P may relatively increase in order to sufficiently removing the crack CR and flatten the cross-section. Thus, as the thickness of the base glass substrate GP-P decreases, a ratio of the length $L_{SS3}$ of the third side surface SS3 to the thickness $L_{GP}$ of the glass substrate GP may decrease.

In an exemplary embodiment, when the thickness $L_{GP}$ of the glass substrate GP is equal to or greater than about 70 μm and equal to or less than about 100 μm, the length $L_{SS3}$ of the third side surface SS3 may be equal to or greater than about 0.3 times and equal to or less than about 0.7 times of the thickness $L_{GP}$ of the glass substrate GP or equal to or greater than about 0.5 times and equal to or less than about 0.7 times of the thickness $L_{GP}$ of the glass substrate GP, for example. In an exemplary embodiment, when the thickness $L_{GP}$ of the glass substrate GP is equal to or greater than about 40 μm and equal to or less than about 70 µm, the length $L_{SS3}$ of the third side surface SS3 may be equal to or greater than about 0.4 times and equal to or less than about 0.6 times of the thickness $L_{GP}$ of the glass substrate GP or equal to or greater than about 0.3 times and equal to or less than about 0.6 times of the thickness $L_{GP}$ of the glass substrate GP, for example. In an exemplary embodiment, when the thickness $L_{GP}$ of the glass substrate GP is equal to or greater than about 15 µm and equal to or less than about 40 µm, the length $L_{SS3}$ of the third side surface SS3 may be equal to or greater than about 0.3 times and equal to or less than about 0.5 times of the thickness $L_{GP}$ of the glass substrate GP, for example.

When the thickness $L_{GP}$ of the glass substrate GP and the length $L_{SS3}$ of the third side surface SS3 satisfy the above-described range, the glass substrate may have an improved bending strength and an excellent durability against an external impact.

Referring to FIG. 6D, the method for manufacturing the glass substrate GP in an exemplary embodiment may further include a chemical strengthening process. The glass substrate GP may include a first alkali metal cation. The process of chemically strengthening the glass substrate GP may include an ion exchange process of exchanging the second alkali metal cation with the first alkali metal cation having an ion radius greater than that of the second alkali metal cation.

The ion exchange may be performed by providing a solution SOL including the first alkali metal cation and heating the solution SOL at a temperature equal to or greater than about 350° C. and equal to or less than about 500° C.

As the second alkali metal cation included in the glass substrate GP is exchanged with the first alkali metal cation, a surface strengthening of the glass substrate GP may be performed. In an exemplary embodiment, the glass substrate GP-1 having a strengthened surface by exchanging a Na+ ion of a surface of the glass substrate GP with a K+ ion may be provided (refer to FIG. 3B), for example.

FIG. 6E illustrates a glass substrate GP-2 that has undergone the front side etching. Referring to FIG. 6E, the front side etching may be performed on the glass substrate GP-1 in an exemplary embodiment. The front side etching process of the glass substrate GP-1 may include a process of etching the glass substrate GP-1 by a dip method. Since a crack of a surface of the glass substrate GP-1 may be removed through the front side etching of the glass substrate GP-1, a bending strength may increase. As illustrated in FIG. 6E, a reinforced area CS-1 of the glass substrate GP-2 that has undergone the front side etching may be formed by removing a portion of the reinforced area CS.

However, the invention is not limited to the order of the front side etching process. In an exemplary embodiment, the chemical strengthening may be performed before the chemical strengthening process, for example. In an alternative exemplary embodiment, the front side etching process may be performed before and after the chemical strengthening process. In another exemplary embodiment, the front side etching process may be omitted.

Figure 7A:
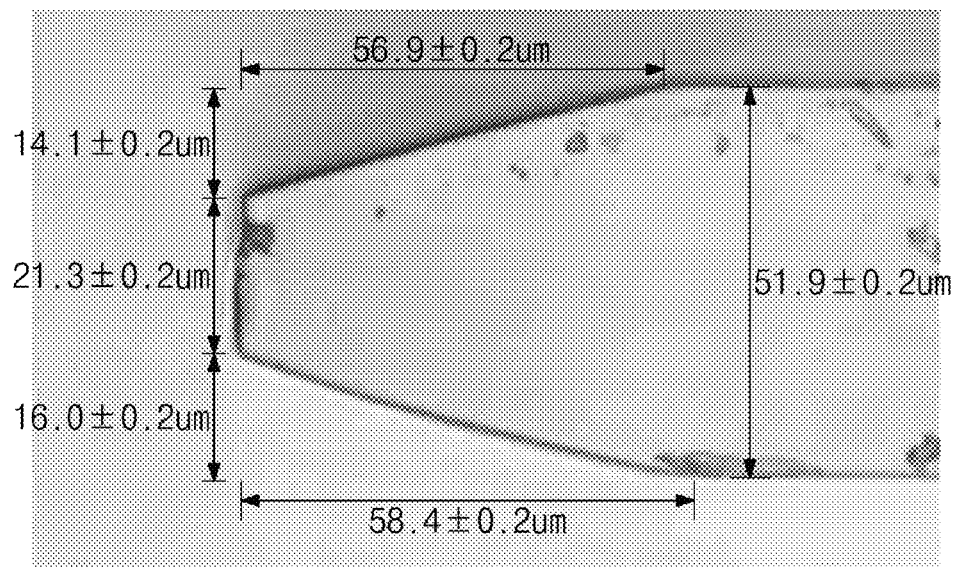
FIGS. 7A to 7C are cross-sectional views illustrating an exemplary embodiment and a comparative example of a glass substrate.
Figure 7B:
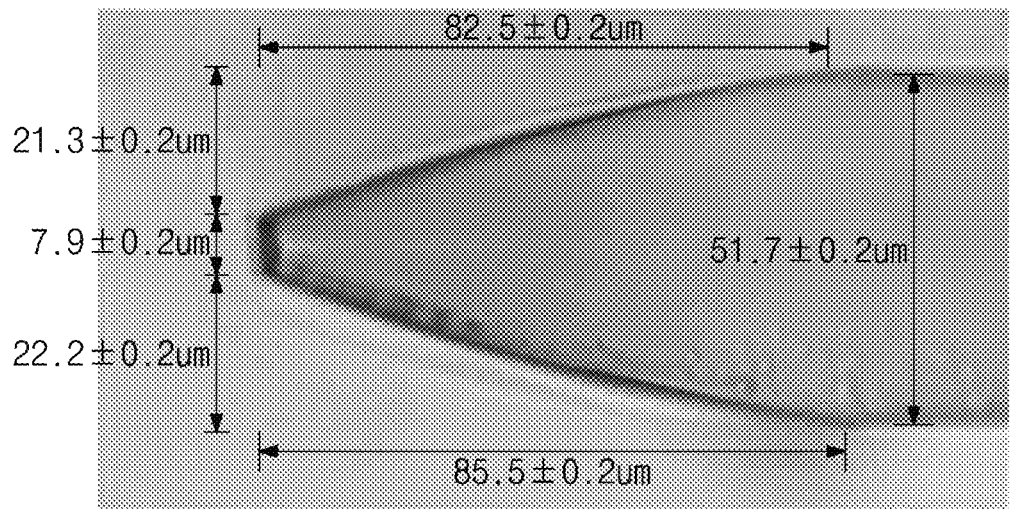
Figure 7C:
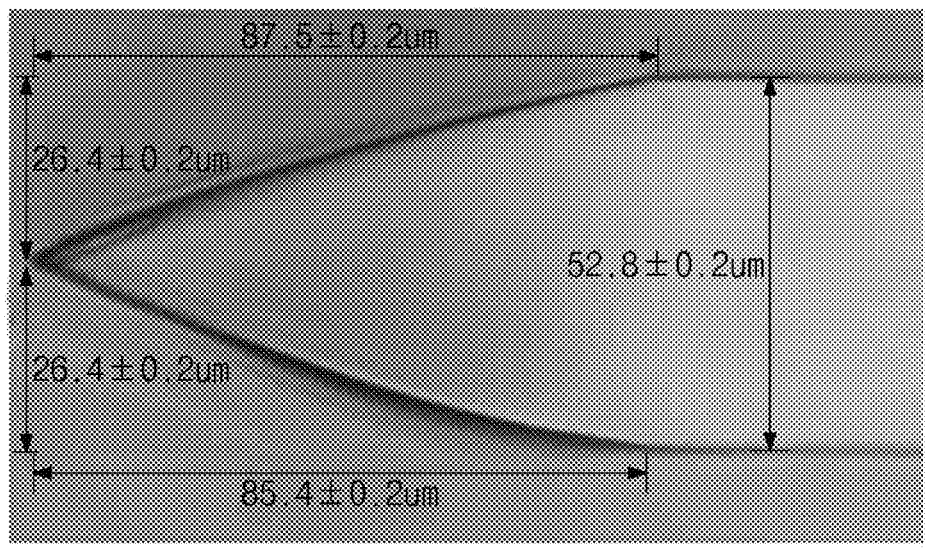

FIGS. 7A to 7C are cross-sectional views illustrating an exemplary embodiment and a comparative example of the glass substrate GP. FIG. 9 is a schematic view illustrating an exemplary embodiment of a method for measuring a bending strength of the glass substrate. FIG. 9 is a chart obtained by measuring a bending strength of an exemplary embodiment and a comparative example of the glass substrate. Hereinafter, the glass substrate GP in an exemplary embodiment of the invention will be described in detail with reference to FIGS. 7A to 7C, 8, and 9, an exemplary embodiment, and a comparative example. Also, Following embodiments give further detailed description to help understanding of the invention, but do not limit the scope of the invention.

1. Method for Evaluating Bending Strength of Glass Substrate

Embodiment 1, Comparative example 1, and Comparative example 2 of the glass substrate having values in FIGS. 7A to 7C and Table 1 below are prepared. The glass substrate in Embodiment 1, Comparative example 1, and Comparative example 2 is manufactured by performing the chemical strengthening process and the front side etching process after the cross-section etching. In Table 1 below, $L_{GP}$ is the thickness of the glass substrate, $L_{SS1}$ is the minimum distance between the third side surface and the first plane, $L_{SS2}$ is the minimum distance between the third side surface and the second plane, and $L_{SS3}$ is the length of the third side surface. All units are µm. ±0.2 µm is a value of an error range capable of occurring during measurement.

TABLE 1

|  | $L_{GP}$ | $L_{SS1}$ | $L_{SS2}$ | $L_{SS3}$ |
| --- | --- | --- | --- | --- |
| Embodiment 1 | 51.9 ± 0.2 | 14.1 ± 0.2 | 16.0 ± 0.2 | 21.3 ± 0.2 |
| Comparative example 1 | 51.7 ± 0.2 | 21.3 ± 0.2 | 22.2 ± 0.2 | 7.9 ± 0.2 |
| Comparative example 2 | 52.8 ± 0.2 | 26.4 ± 0.2 | 26.4 ± 0.2 | — |

The bending strength of the glass substrate GP in Embodiment 1, Comparative example 1, and Comparative example 2 is evaluated by a 2-point bending test and calculated by equation 1 below.

$$\sigma = 1.198 E \frac{t}{D-t} \qquad [\text{Equation 1}]$$

In the equation 1, E is Young's modulus, t is the thickness of the glass substrate GP, and D is a minimum distance between a first plate PT1 and a second plate PT2.

Figure 8:
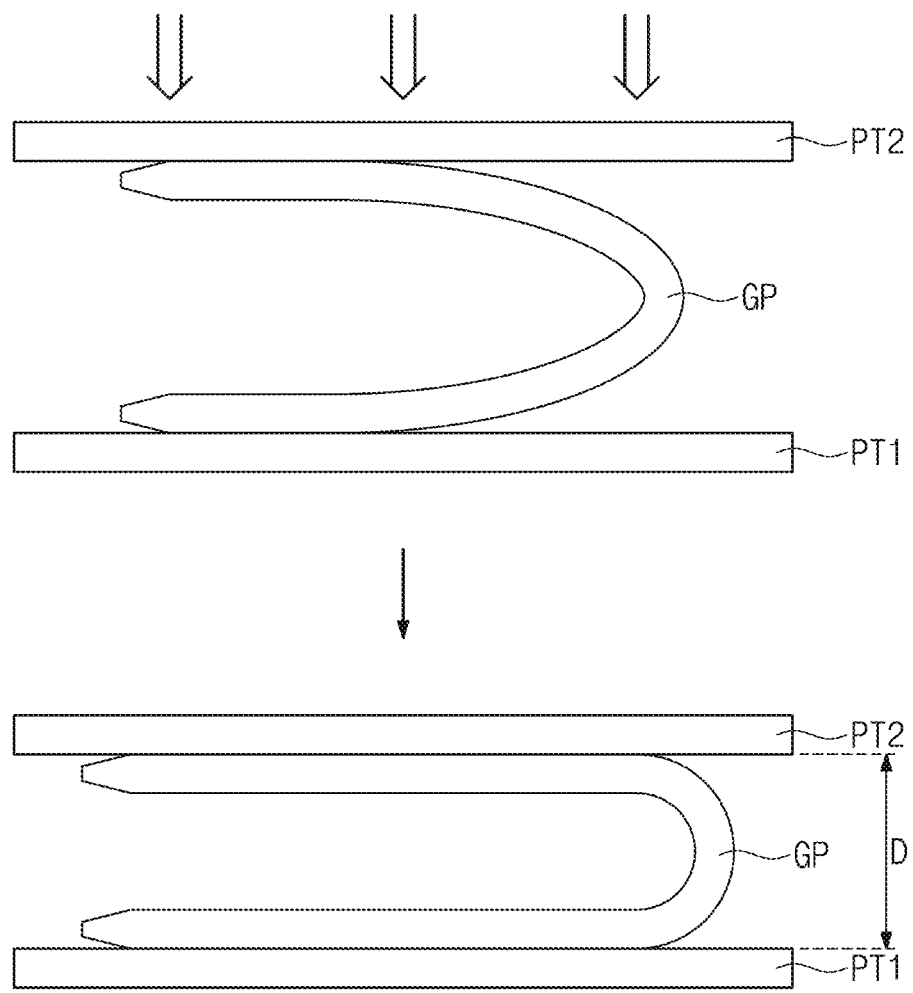
FIG. 8 is a schematic view illustrating an exemplary embodiment of a method for measuring a bending strength of the glass substrate.
Figure 9:
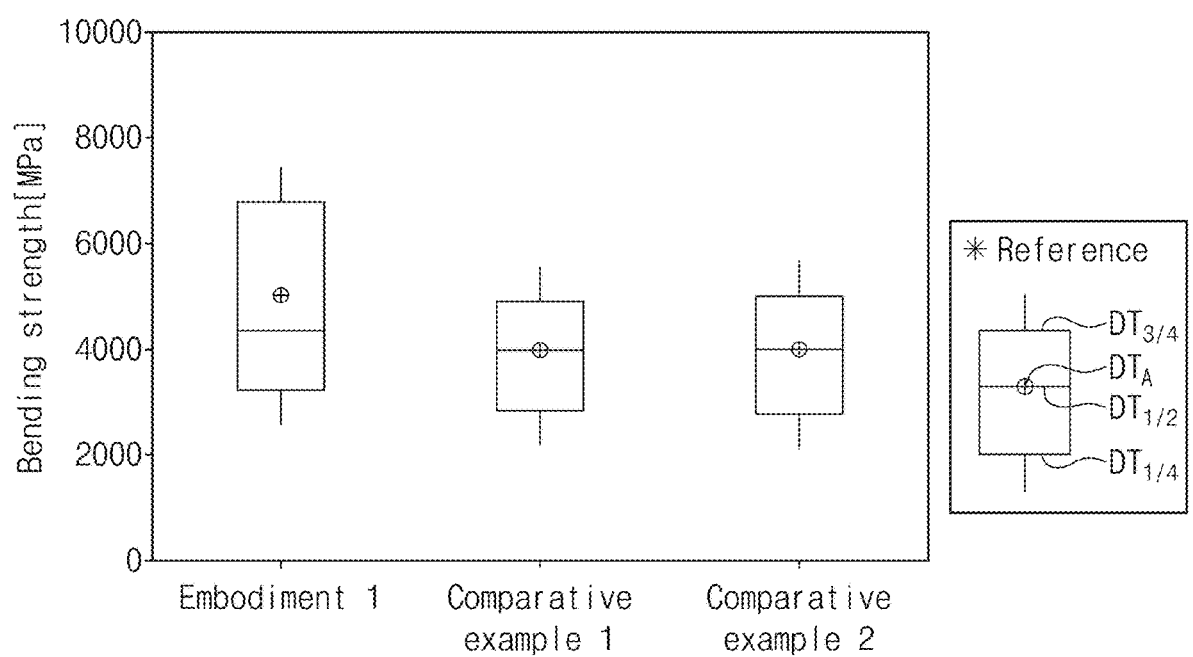
FIG. 9 is a chart obtained by measuring a bending strength of an exemplary embodiment and a comparative example of the glass substrate.

Referring to FIG. 8, the glass substrate GP is disposed between the first plate PT1 and the second plate PT2. Thereafter, while the first plate PT1 is fixed, the second plate PT2 slowly descends. Thereafter, a minimum distance D between the first plate PT1 and the second plate PT2 just before the glass substrate GP is broken is calculated.

2. Evaluation Result of Bending Strength of Glass Substrate

Referring to a reference box of FIG. 9, $DT_{1/4}$ is data for a ¼-th value when measured data are arranged in an ascending order, $DT_{1/2}$ is data for an intermediate value, and $DT_{3/4}$ is data for a ¾-th value. $DT_A$ is an average value of whole data.

The average value of the bending strength measured in the glass substrate in Embodiment 1 is about 5009 megapascals (MPa), and a minimum value is about 2880 MPa. The average value of the bending strength measured in the glass substrate according to Comparative example 1 is about 3996 MPa, and a minimum value is about 2079 MPa. The average value of the bending strength measured in the glass substrate according to Comparative example 2 is about 4012 MPa, and a minimum value is about 1318 MPa.

When Embodiment 1, Comparative example 1, and Comparative example 2 are compared, Embodiment 1 achieves an excellent effect in comparison with Comparative example 1 and Comparative example 2. In detail, it is verified that the average bending strength of Embodiment 1 is about 25% greater than that of each of Comparative example 1 and Comparative example 2.

Since the third side surface of the glass substrate in Embodiment 1 has a thickness that is equal to or greater than about 0.3 times and equal to or less than about 0.7 times of the thickness of the glass substrate, it is verified that the bending strength of Embodiment 1 is greater than that of each of Comparative example 1 and Comparative example 2. In detail, it is determined that the glass substrate in Embodiment 1 secures a sufficient side strength because the thickness of the third side surface is equal to or greater than about 0.3 times of the thickness of the glass substrate, and it is verified that damages such as a crack generated in the surface of the glass substrate are sufficiently removed because the thickness of the third side surface is equal to or less than about 0.7 times of the thickness of the glass substrate.

A foldable glass substrate in an exemplary embodiment has a thickness equal to or greater than about 15 μm and equal to or less than about 100 μm, and includes a top surface, a bottom surface facing the top surface, and a side surface extending from each of the top and bottom surfaces. The side surface includes a first side surface extending at a first angle from the top surface, a second side surface extending at a second angle from the bottom surface, and a third side surface extending from each of the first side surface and the second side surface. A length of the third side surface is equal to or greater than about 0.3 times and equal to or less than about 0.7 times of a minimum distance between the top surface and the bottom surface. Thus, the foldable glass substrate in an exemplary embodiment may have an improved durability against an impact.

The foldable glass substrate in the exemplary embodiment of the invention may have the substantially higher bending strength and the substantially higher durability that those of the conventional foldable display device.

The foldable display device in the exemplary embodiment of the invention may have the substantially high bending strength and the substantially high durability.

Although the exemplary embodiments of the invention have been described, it is understood that the invention should not be limited to these exemplary embodiments but various changes and modifications may be made by one ordinary skilled in the art within the spirit and scope of the invention as hereinafter claimed. Thus, to the maximum extent allowed by law, the scope of the invention is to be determined by the broadest permissible interpretation of the invention, and shall not be restricted or limited by the foregoing detailed description.

What is claimed is:

1. A foldable glass substrate comprising:
   a top surface;
   a bottom surface facing the top surface; and
   a side surface extending from each of the top surface and the bottom surface, the side surface comprising:
   a first side surface extending at a first angle from the top surface;
   a second side surface extending at a second angle from the bottom surface; and
   a third side surface extending from each of the first side surface and the second side surface,
   wherein a length of the third side surface in a direction substantially perpendicular to at least one of the top surface and the bottom surface is equal to or greater than about 0.3 times and equal to or less than about 0.7 times of a minimum distance between the top surface and the bottom surface, and
   the minimum distance is equal to or greater than about 15 micrometers and equal to or less than about 100 micrometers.

2. The foldable glass substrate of claim 1, wherein the top surface and the bottom surface are parallel to each other, and the third side surface is substantially perpendicular to each of the top surface and the bottom surface.

3. The foldable glass substrate of claim 1, wherein a first plane extending from and parallel to the top surface and a second plane extending from and parallel to the bottom surface are defined, and
   a minimum distance between the third side surface and the first plane is equal to or greater than about 0.9 times and equal to or less than about 1.1 times of a minimum distance between the third side surface and the second plane.

4. The foldable glass substrate of claim 1, wherein the length is equal to or greater than about 5 micrometers and equal to or less than about 70 micrometers.

5. The foldable glass substrate of claim 1, wherein the minimum distance is equal to or greater than about 70 micrometers and equal to or less than about 100 micrometers, and
   the length is equal to or greater than about 35 micrometers and equal to or less than about 70 micrometers.

6. The foldable glass substrate of claim 1, wherein the minimum distance is equal to or greater than about 40 micrometers and equal to or less than about 70 micrometers, and
   the length is equal to or greater than about 16 micrometers and equal to or less than about 42 micrometers.

7. The foldable glass substrate of claim 1, wherein the minimum distance is equal to or greater than about 15 micrometers and equal to or less than about 40 micrometers, and
   the length is equal to or greater than about 4.5 micrometers and equal to or less than about 20 micrometers.

8. The foldable glass substrate of claim 1, wherein each of the first angle and the second angle is an obtuse angle.

9. The foldable glass substrate of claim 1, wherein each of the first angle and the second angle is equal to or greater than about 160 degrees and equal to or less than about 170 degrees.

10. The foldable glass substrate of claim 1, further comprising a reinforced area and a non-reinforced area surrounding the reinforced area and having a compressive stress less than that of the reinforced area.

11. The foldable glass substrate of claim 10, wherein the reinforced area comprises a first alkali metal cation, and
    the non-reinforced area comprises a second alkali metal cation having an ion radius less than that of the first alkali metal cation.

12. A foldable glass substrate comprising:
    a top surface;
    a bottom surface facing the top surface; and
    a side surface extending from each of the top surface and the bottom surface, the side surface comprising:
    a first side surface extending at a first obtuse angle from the top surface;
    a second side surface extending at a second obtuse angle from the bottom surface; and
    a third side surface extending from each of the first side surface and the second side surface, wherein each of the first obtuse angle and the second obtuse angle is equal to or greater than about 160 degrees and equal to or less than about 170 degrees, and a minimum distance between the top surface and the bottom surface is equal to or greater than about 15 micrometers and equal to or less than about 100 micrometers.

13. The foldable glass substrate of claim 12, wherein the first obtuse angle is equal to or greater than about 0.8 times and equal to or less than about 1.2 times of the second obtuse angle.

14. The foldable glass substrate of claim 12, wherein a length of the third side surface in a direction substantially perpendicular to at least one of the top surface and the bottom surface is equal to or greater than about 0.3 times and equal to or less than about 0.7 times of the minimum distance.

15. A foldable display device comprising:
a display module; and
a glass substrate disposed on the display module, comprising a folding portion and first and second non-folding portions, which are spaced apart from each other with the folding portion therebetween, and having a thickness equal to or greater than about 15 micrometers and equal to or less than about 100 micrometers in a predetermined direction, the glass substrate comprising:
a top surface;
a bottom surface facing the top surface;
a first inclined surface extending from the top surface;
a second inclined surface extending from the bottom surface; and
a side surface extending from each of the first inclined surface and the second inclined surface,
wherein a length of the side surface in the predetermined direction is equal to or greater than about 0.3 times and equal to or less than about 0.7 times of the thickness.

16. The foldable display device of claim 15, wherein the top surface is defined as a display surface, and
the foldable display device operates in at least one of: a first operation mode, in which a display surface of the first non-folding portion faces a display surface of the second non-folding portion; and a second operation mode, in which the folding portion is folded, and each of the display surface of the first non-folding portion and the display surface of the second non-folding portion is exposed to an outside.

17. The foldable display device of claim 15, wherein the length is equal to or greater than about 5 micrometers and equal to or less than about 70 micrometers.

18. The foldable display device of claim 15, wherein each of the first inclined surface and the second inclined surface has an inclination angle equal to or greater than about 160° and equal to or less than about 170°.

19. The foldable display device of claim 15, wherein the side surface is substantially parallel to the predetermined direction of the glass substrate.

20. The foldable display device of claim 15, wherein the display module comprises:
a display element layer;
a thin-film encapsulation layer which seals the display element layer; and
an input sensing layer directly disposed on the thin-film encapsulation layer.

* * * * *